United States Patent
Saito et al.

(10) Patent No.: US 7,664,197 B2
(45) Date of Patent: *Feb. 16, 2010

(54) AM RECEIVING CIRCUIT

(75) Inventors: Yasuji Saito, Gunma (JP); Yutaka Hirakoso, Koga (JP); Masaaki Taira, Akashi (JP)

(73) Assignee: Sanyo Electric Co., Ltd., Osaka (JP)

( * ) Notice: Subject to any disclaimer, the term of this patent is extended or adjusted under 35 U.S.C. 154(b) by 451 days.

This patent is subject to a terminal disclaimer.

(21) Appl. No.: 10/599,456

(22) PCT Filed: Feb. 23, 2005

(86) PCT No.: PCT/JP2005/002898

§ 371 (c)(1),
(2), (4) Date: Sep. 28, 2006

(87) PCT Pub. No.: WO2005/099106

PCT Pub. Date: Oct. 20, 2005

(65) Prior Publication Data

US 2007/0206706 A1 Sep. 6, 2007

(30) Foreign Application Priority Data

Mar. 30, 2004 (JP) ............................ 2004-099360

(51) Int. Cl.
*H03C 5/00* (2006.01)
*H04L 27/02* (2006.01)

(52) U.S. Cl. ........................ 375/268; 375/285; 375/316; 375/320; 375/350; 381/94.1; 455/226.4; 455/312

(58) Field of Classification Search .................. 375/268, 375/285, 316, 320, 340, 345, 350; 381/94.1, 381/94.7; 455/226.4, 234.1, 312
See application file for complete search history.

(56) References Cited

U.S. PATENT DOCUMENTS 3,691,465 A * 9/1972 McFadyen et al. ....... 455/252.1

(Continued)

FOREIGN PATENT DOCUMENTS

| JP | 4-207231 | 7/1992 |
| JP | 04-207231 | 7/1992 |
| JP | 7-22975 | 1/1995 |
| JP | 2002-353830 | 12/2002 |
| JP | 2005-79870 | 3/2005 |

OTHER PUBLICATIONS

Chinese Patent Office, Office Action for Application No. 2005800102593, Mail date: Nov. 28, 2008.
Japanese Patent Office, Office Action for Application No. 2004-099360, Mail date: Sep. 9, 2008.

*Primary Examiner*—Jean B Corrielus
(74) *Attorney, Agent, or Firm*—SoCal IP Law Group LLP; Steven C. Sereboff; John E. Gunther

(57) ABSTRACT

An AM receiving circuit is disclosed which comprises an intermediate frequency amplifying unit that generates an intermediate frequency signal from a broadcast wave signal received by an antenna to amplify and output the intermediate frequency signal; an AGC (Automatic Gain Control) unit that sets gain of the intermediate frequency amplifying unit depending on electric field intensity of the broadcast wave signal; and an AM detecting unit that detects the intermediate frequency signal output from the intermediate frequency amplifying unit, wherein the AM receiving circuit comprises a sound quality compensating unit including: a filter unit that extracts a predetermined frequency band of the audio signal; an amplifying unit that boosts or attenuates the audio signal in the predetermined frequency band extracted from the filter unit; and a controlling unit that controls filter characteristics of the filter unit and sets a boosting function or an attenuating function of the amplifying unit, depending on the electric field intensity of the broadcast wave signal.

16 Claims, 4 Drawing Sheets

U.S. PATENT DOCUMENTS

| | | | | |
|---|---|---|---|---|
| 4,105,976 A | * | 8/1978 | Payden | 455/252.1 |
| 4,198,603 A | * | 4/1980 | Aldridge et al. | 455/249.1 |
| 4,517,602 A | * | 5/1985 | Murphy et al. | 348/738 |
| 4,563,651 A | * | 1/1986 | Ohta et al. | 329/318 |
| 4,893,349 A | * | 1/1990 | Eastmond et al. | 455/205 |
| 4,965,833 A | * | 10/1990 | McGregor et al. | 381/83 |
| 5,095,534 A | * | 3/1992 | Hiyama | 455/266 |
| 5,253,298 A | * | 10/1993 | Parker et al. | 381/13 |
| 5,263,186 A | * | 11/1993 | Gornati et al. | 455/241.1 |
| 5,369,470 A | * | 11/1994 | Hansen | 455/296 |
| 5,465,406 A | * | 11/1995 | Whitecar et al. | 455/234.1 |
| 5,930,693 A | * | 7/1999 | Kennedy et al. | 455/234.1 |
| 6,226,504 B1 | * | 5/2001 | Takagi | 455/234.1 |
| 6,307,598 B1 | * | 10/2001 | Limberg | 348/729 |
| 6,590,619 B1 | * | 7/2003 | Kawano | 348/738 |
| 6,643,498 B1 | * | 11/2003 | Miyajima | 455/230 |
| 6,795,559 B1 | * | 9/2004 | Taura et al. | 381/94.8 |
| 6,993,305 B2 | * | 1/2006 | Kasperkovitz | 455/232.1 |
| 7,418,379 B2 | * | 8/2008 | Vierthaler | 704/225 |
| 7,457,757 B1 | * | 11/2008 | McNeill et al. | 704/500 |

* cited by examiner

AM RECEIVING CIRCUIT

CROSS-REFERENCE TO RELATED APPLICATION

This application claims the benefit of priority to International Patent Application PCT/JP2005/002898, filed Feb. 23, 2005, of which full contents are incorporated herein by reference.

BACKGROUND OF THE INVENTION

1. Technical Field

The present invention relates to an AM receiving circuit that compensates sound quality of an audio signal depending on electric field intensity of a broadcast-wave signal.

2. Description of the Related Art

An AM (amplitude modulation) mode is a method of transmitting desired broadcast-wave signals (modulated signals) overlapped with amplitude of a frequency (carrier) that can be emitted from a broadcast station and is mainly used in middle-wave radio (526.5 to 1606.5 kHz). Since the electric wave in the frequency band for the middle-wave broadcast is propagated not only as surface wave but also as space wave that is reflected, especially at night, by the ionized layer (E layer) near 100 km above the ground, a wide service area can be ensured and a stable service can be supplied to mobile objects such as automobiles.

An AM receiving circuits receiving AM signals generally uses a superheterodyne detection mode. The superheterodyne detection mode is a mode of combining a signal from a broadcast station with a signal from an oscillation (local oscillation) circuit built into a receiving apparatus to detect and convert this beat into an intermediate frequency for amplification and demodulation and is characterized in that high amplification gain can be easily acquired and that cross talk can be easily prevented. Although the receiving circuit receiving AM signals must include a band-pass filter that allows passage of a frequency of a desired broadcast wave, it is very difficult to continuously change a center frequency without changing band property of a filter, the superheterodyne detection mode employs a method of changing a local oscillation frequency and allowing passage of only an intermediate frequency converted to a certain frequency.

However, in the AM receiving circuit, the AM detection level may fluctuate depending on electric field intensity of broadcast wave signals received by an antenna and cross talk may be easily generated as a result.

Therefore, a method is proposed to constrain the generation of cross talk by providing an AGC circuit for setting gains in a front end unit that processes a received RF (Radio Frequency) signal and an IF unit that processes an IF (Intermediate Frequency) signal and by changing the gains with the operation of the AGC circuit depending on the electric field intensity of the broadcast wave signals (see, e.g., patent document 1). This can constrain output fluctuations of the audio signal associated with fluctuations of the electric field intensity of the broadcast wave signals.

However, when the broadcast wave signal received by the antenna has the weak electric field intensity, the AGC circuit operates so as to increase the gains. In this case, with regard to the audio signal output as sound from a speaker of the AM receiver, a rate of noise generated by amplifiers, etc., is increased as the electric field intensity weakens in the broadcast wave signal received by the antenna. That is, the S/N ratio (Signal to Noise ratio) of the audio signal is deteriorated.

Patent document 1: Japanese Patent Application Laid-Open Publication No. 1995-22975.

When a broadcast station desired to be received (desired station) has an interfering station with a frequency near the broadcast wave frequency of the desired station, if the desired station is selected by the AM receiver, the broadcast wave signal of the desired station is affected by the frequency of the interfering station. In this case, the AGC circuit operates so as to reduce the reception levels of signals from the desired station and the interfering station and performs adjustment to reduce the gains of the front end unit and the IF unit. As a result, the desired station to be selected is suppressed by the effect of the interfering station.

To prevent the suppression, the gain of the AGC circuit can be increased. However, if the gain of the AGC circuit is simply increased, it is problematic that the saturation SN of the audio signal is deteriorated due to the constraint of the dynamic range of the IF unit.

Therefore, the object of the present invention is to provide an AM receiving circuit which improves suppression characteristics.

SUMMARY OF THE INVENTION

In order to solve the above problem, the major aspect of the present invention provides an AM receiving circuit comprising an intermediate frequency amplifying unit that generates an intermediate frequency signal from a broadcast wave signal received by an antenna to amplify and output the intermediate frequency signal; an AGC (Automatic Gain Control) unit that sets gain of the intermediate frequency amplifying unit depending on electric field intensity of the broadcast wave signal; and an AM detecting unit that detects the intermediate frequency signal output from the intermediate frequency amplifying unit, wherein the AM receiving circuit comprises a sound quality compensating unit including: a filter unit that extracts a predetermined frequency band of the audio signal; an amplifying unit that boosts or attenuates the audio signal in the predetermined frequency band extracted from the filter unit; and a controlling unit that controls filter characteristics of the filter unit and sets a boosting function or an attenuating function of the amplifying unit, depending on the electric field intensity of the broadcast wave signal. According to the present invention, an AM receiving circuit with improved suppression characteristics can be provided.

BRIEF DESCRIPTION OF THE DRAWINGS

For thorough understanding of the present invention and the advantages thereof, the following description should be referenced in conjunction with the accompanying drawings.

DETAILED DESCRIPTION OF THE INVENTION

From the contents of the description and the accompanying drawings, at least the following details will become apparent.

==Overall Configuration of AM Receiving Circuit==

Figure 1:
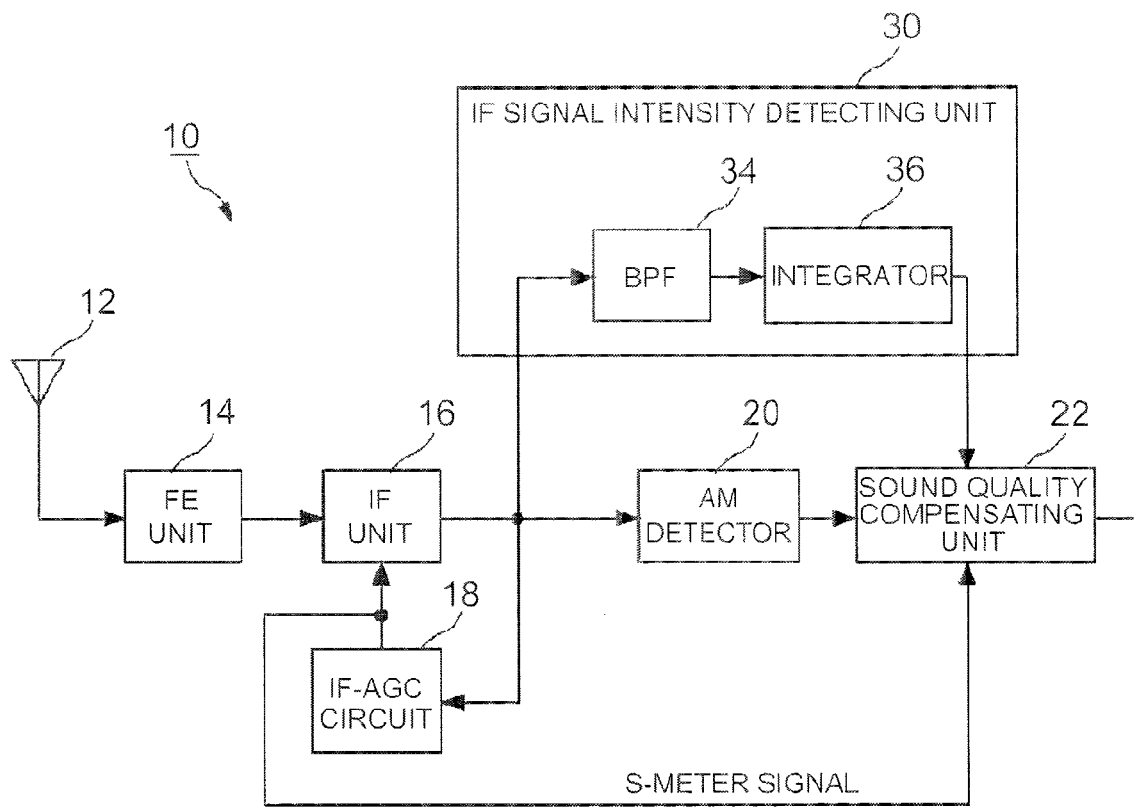
FIG. 1 is a block diagram of an AM receiving circuit of the present invention.
Figure 2:
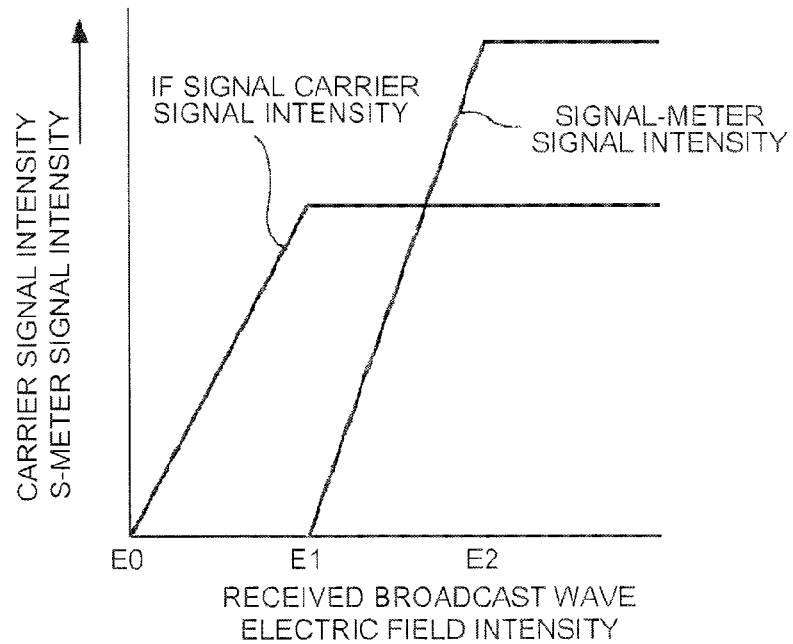
FIG. 2 is a characteristic diagram of relationships of intensities of an IF signal carrier intensity signal and a signal-meter signal with received broadcast wave electric field intensity.

An overall configuration of an AM receiving circuit 10 of the present invention will be described with reference to FIG. 1 and FIG. 2. FIG. 1 is a block diagram of an AM receiving circuit of the present invention. FIG. 2 is a characteristic diagram of relationships of intensities of an IF signal carrier intensity signal and a signal-meter signal with received broadcast wave electric field intensity.

A broadcast wave signal is received by an antenna 12 and input to an FE (front end) unit 14. The FE unit 14 synchronously selects and outputs the broadcast wave (RF) signal. The FE unit 14 may include RF amplifier for amplifying the RF signal.

An IF unit 16 has a function of converting a carrier frequency, includes a local oscillator that outputs a signal with a predetermined frequency (typically, 450 kHz) different from a desired broadcast wave frequency and a mixer that mixes the broadcast wave signal and the local oscillation signal, and converts the received carrier of the broadcast wave signal into a predetermined intermediate frequency (typically, 450 kHz). The intermediate frequency is extracted by a band-pass filter (BPF) using the intermediate frequency as a center frequency to form an IF signal, which is an amplitude modulation signal having the same information as the broadcast wave signal, and the IF signal is amplified by an amplifier and output. Although the IF unit 16 has a one-stage configuration that generates an IF signal using a carrier of 450 KHz, the IF unit 16 may have a two-stage configuration including a first IF stage that up-converts to 10.7 MHz and a second IF stage that down-converts a first IF signal acquired from the first IF stage into 450 kHz. Since 10.7 MHz of the IF signal is a frequency used in an FM receiving circuit, the circuit after the IF unit can be shared by receivers receiving AM broadcast wave signals and FM broadcast wave signals in this configuration.

The input signal intensity to the IF unit 16 is proportional to the intensity of the broadcast wave signal received by the antenna 12, i.e., the electric field intensity of the broadcast wave signal, and if the electric field intensity is changed in accordance with receiving locations and receiving stations, the output signal level is fluctuated and the level of the output audio signal is also fluctuated. Therefore, an IF-AGC circuit 18 (AGC unit: automatic gain control circuit) is included to maintain the output signal level of the IF unit 16 constant. The IF-AGC circuit 18 receives a portion of the output of the intermediate frequency signal output from the IF unit 16, forms a direct-current voltage (AGC voltage: signal-meter signal) proportional to amplitude with a diode, and controls the gain of the amplifier of the IF unit 16 based on the signal-meter signal. That is, the IF-AGC circuit 18 increases the gain of the amplifier of the IF unit 16 when the electric field intensity of the received broadcast wave signal is weak and reduces the gain of the amplifier of the IF unit 16 when the electric field intensity of the received broadcast wave signal is intense such that the fluctuations of the electric field intensity of the received broadcast wave signal do not appear as the fluctuations of the level of the audio signal.

In the IF unit with a two-stage configuration, the signal-meter signal may be formed from the output of the first IF stage or the output of the second IF stage. In the receiving circuit with a DSP (digital signal processor) configuration that digitalizes and modulates IF signals, the signal-meter signal may be calculated and formed from a digital IF signal.

The output signal of the IF unit 16 is input to the AM detecting unit 20. The AM detecting unit 20 removes a carrier component of the intermediate frequency signal output from the IF unit 16 to acquire an audio signal that is an original modulated signal.

The audio signal output from the AM detecting unit 20 is input to a sound quality compensating unit 22. The sound quality compensating unit 22 changes the frequency characteristics of the sound signal to compensate the sound quality. It is desirable that such sound quality compensation is performed depending on the electric field intensity of the received broadcast wave signal. For example, although the sound quality compensation is not needed when the electric field intensity of the received broadcast wave signal is sufficiently intense, if the electric field intensity of the received broadcast wave signal is weak, the gain of the amplifying circuit in the IF unit 16 is increased by the IF-AGC circuit 18, a rate of noise is increased relative to the audio signal in a wide band generated by the amplifying circuit. In such a case, the rate of noise to the audio signal may be reduced to constrain auditory unpleasantness by attenuating bands that are away from the center frequency of the audio signal; the overall output level may be increased such that the audio signal is easily heard; and the above methods may be combined. Such compensation may be switched depending on the electric field intensity of the received broadcast wave signal or the degree of the compensation may be changed proportional to the electric field intensity of the received broadcast wave signal. The sound quality compensating unit 22 may be constituted by an analogue circuit or may be constituted by a DSP (digital signal processor) that performs the process with digital signals. Details of the sound quality compensating unit 22 will be described later.

The audio signal output from the sound quality compensating unit 22 is sent to and amplified by an amplifying circuit (not shown) on a subsequent stage and is output from a speaker, etc., on a further subsequent stage (not shown).

In the embodiment, the electric field intensity of the received broadcast wave signal is detected based on the carrier intensity of the IF signal, and if the electric field intensity of the received broadcast wave signal is weak, the sound quality compensating unit 22 compensates the sound quality depending on the IF signal carrier intensity. The IF signal carrier intensity is acquired as a signal formed by extracting the carrier frequency component of the IF signal output from the IF unit 16 with a BPF 34 (intermediate frequency filter) and by converting the carrier of the IF signal into a direct-current voltage signal (IF signal carrier intensity signal) with an integrator 36. Therefore, since the intensity of the carrier frequency component of the IF signal is detected in this method, if the electric field intensity of the received broadcast wave signal is weak, the electric field information can be obtained which reflects the electric field intensity. When only the carrier frequency component is selected more acutely, the BPF 34 can remove the effect of noise of other frequencies more thoroughly. Since an IF signal intensity detecting unit 30 is only needed to allow passage of the IF carrier frequency component, it is desirable to use a BPF with a bandwidth narrower than an IF signal ceramic filter for audio signals. If the IF signal is digitalized, it is preferable to perform the BPF process for a narrower bandwidth using a digital signal process.

FIG. 2 shows the intensities of the IF signal carrier intensity signal and the signal-meter signal relative to the electric field intensity of the received broadcast wave signal. When the electric field intensity of the received broadcast wave signal is E1 or less (smaller than a predetermined value), the IF-AGC circuit 18 does not function because of the limitation of the amplification rate of the amplifier, the signal-meter signal is not output, and the IF signal carrier intensity signal is output correspondingly to this electric field intensity.

Therefore, when the electric field intensity of the received broadcast wave signal is E1 or less, the IF signal carrier intensity is information reflecting the electric field intensity at this point. The output of the signal-meter signal is started at the electric field intensity of about 10 to 15 dBμV (E1), which varies depending on circuit configurations, etc., of the FE unit and the IF unit of the receiving circuit.

According to the embodiment, even in the weak electric field intensity (E1 or less) that does not generate the output of the signal-meter signal, the accurate electric field intensity information of the broadcast wave signal can be acquired on the basis of the IF signal carrier intensity, and the sound quality can be compensated appropriately depending on the electric field intensity.

This detection configuration of the electric field intensity information of the broadcast wage signal is especially useful in the AM receiving circuit as compared to the FM receiving circuit. In the FM receiving circuit, the carrier intensity of 450 kHz, i.e., the IF signal frequency is maintained substantially constant by a limiter amplifying circuit regardless of the electric field intensity. However, in the AM receiving circuit, if the electric field intensity of the received broadcast wave signal is weak, the IF signal wave reflects the electric field intensity of the received broadcast wave signal.

If the received broadcast wave electric field intensity shown by the horizontal axis of FIG. 2, i.e., the electric field intensity of the received broadcast wave signal is E1 or more, it is preferable that the sound quality compensating unit 22 performs the sound compensation based on the signal-meter signal. If the electric field intensity of the received broadcast wave signal is E1 or more, the carrier intensity of the IF signal output from the IF unit 16 becomes constant due to the IF-AGC circuit 18, and the intensity of the carrier frequency component of the IF signal is not the information of the electric field intensity of the received broadcast wave signal. In this case, the signal-meter signal is the information reflecting the electric field intensity of the received broadcast wave signal, and the sound quality compensating unit 22 can perform the sound quality compensation based on the signal-meter signal to perform the sound quality compensation appropriate for the received broadcast wave electric field intensity.

The sound quality compensating unit 22 can perform the sound quality compensation based on the IF signal carrier intensity if the electric field intensity of the received broadcast wave signal is weak and based on the signal-meter signal if the electric field intensity of the received broadcast wave signal is intense by adding the both signals. Since the signal-meter signal is not output if the electric field intensity of the received broadcast wave signal is weak (E1 or less) and the IF signal carrier intensity is constant if the electric field intensity of the received broadcast wave signal is intense (E1 or more) as shown in FIG. 2, the added signal of the both signals reflects the electric field intensity of the received broadcast wave signal whether the electric field intensity of the received broadcast wave signal is weak (E1 or less) of intense (E1 or more). The both signals may not be added and may be switched if the IF signal carrier intensity is predetermined intensity (e.g., intensity corresponding to the electric field intensity E1) or if the signal-meter signal intensity is predetermined intensity (e.g., intensity corresponding to the electric field intensity E1).

The AM receiving circuit 10 may include an RF-AGC circuit (not shown) to control an amplification rate of an RF amplifier included in the FE unit 14 corresponding to the output signal intensity of the FE unit 14. In this case, the RF-AGC circuit outputs an RF-AGC control voltage (RF-signal-meter signal); this may be used instead of the signal-meter signal output by the IF-AGC circuit 18; or a signal acquired by selecting from, adding, or combining the both signals may be used as the signal-meter signal.

==Configuration of the Sound Quality Compensating Unit==

Figure 3:
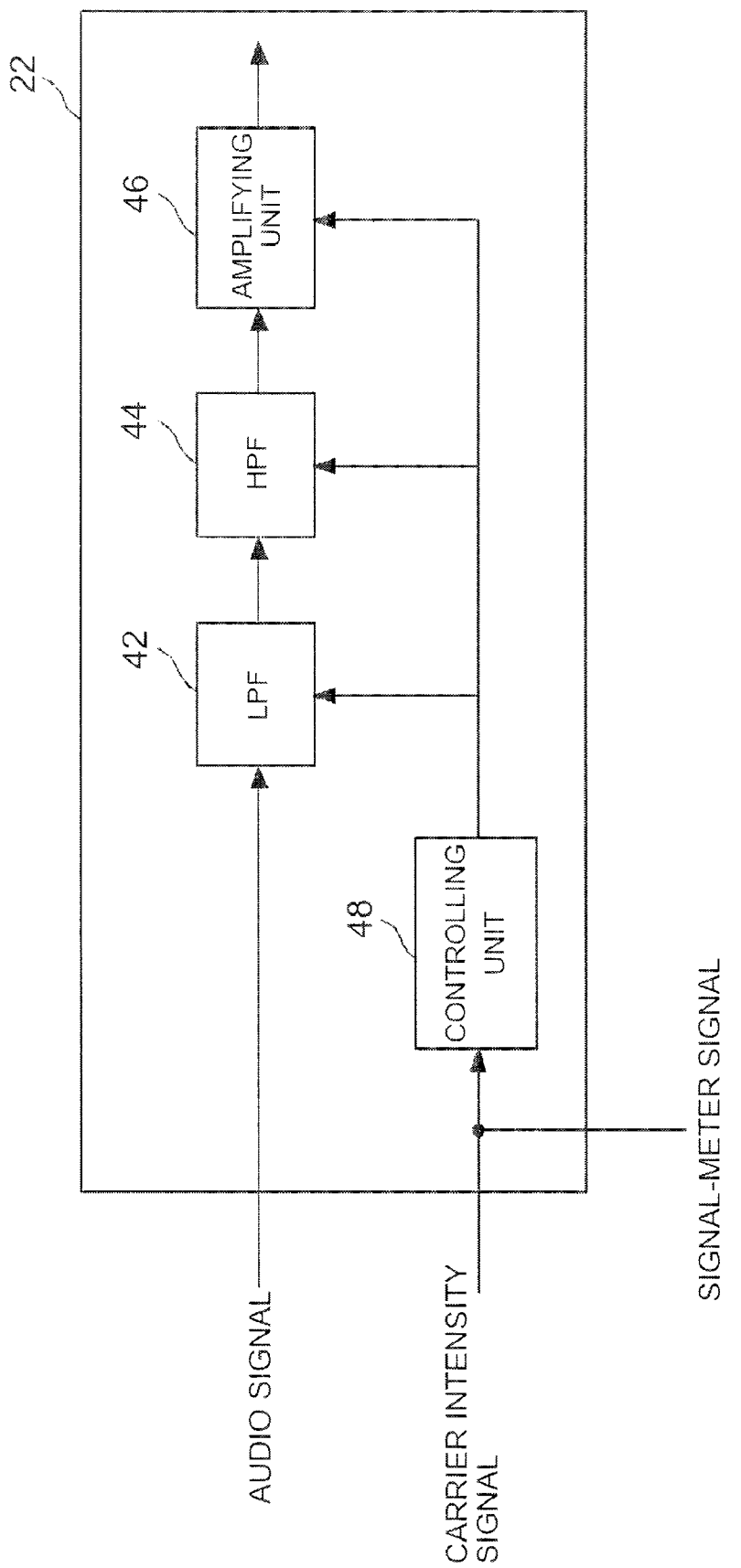
FIG. 3 is a block diagram of a configuration of a sound quality compensating unit applied to the AM receiving circuit of the present invention.
Figure 4:
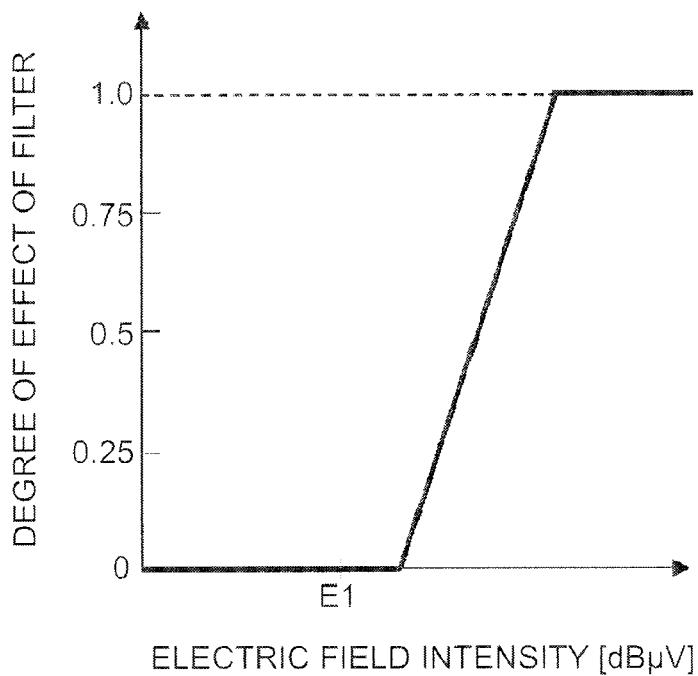
FIG. 4 is a characteristic diagram of characteristics of a low-pass filter (LPF) included in the sound compensating unit.
Figure 5:
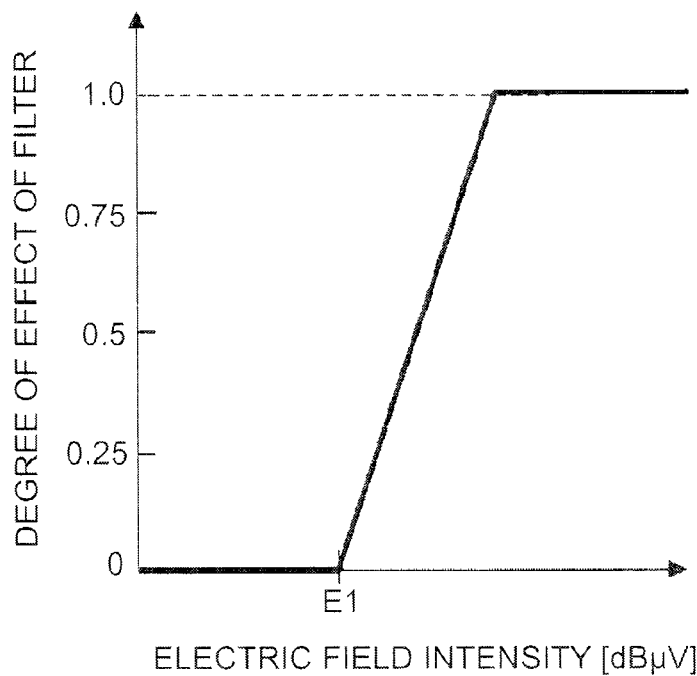
FIG. 5 is a characteristic diagram of characteristics of a high-pass filter (HPF) included in the sound compensating unit.
Figure 6:
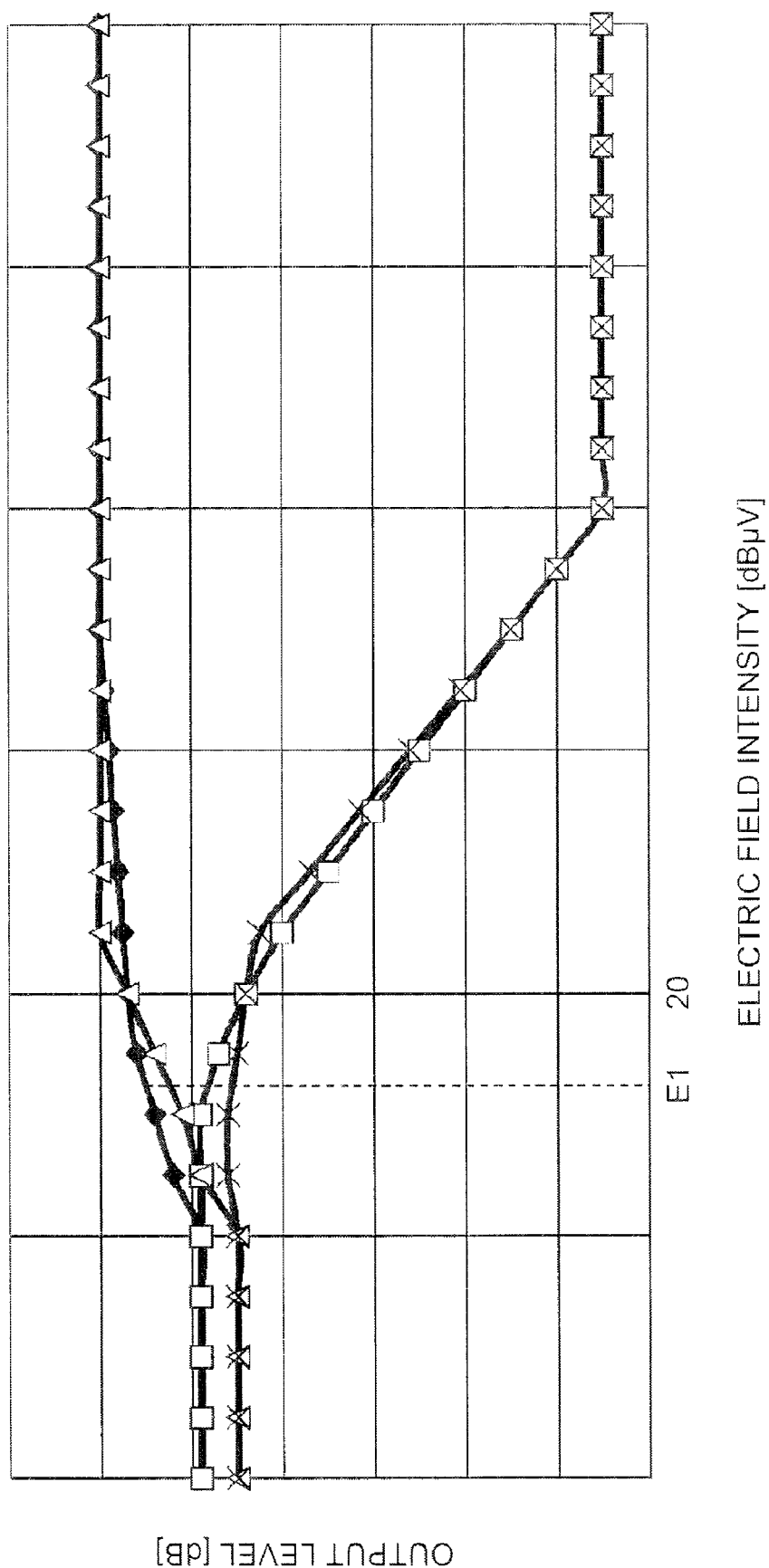
FIG. 6 is a characteristic diagram of characteristics of boosting and attenuating of an amplifying unit included in the sound compensating unit.

Description will be made of a configuration and operation of the sound quality compensating unit applied to the AM receiving circuit of the present invention with reference to FIGS. 3, 4, 5, and 6. FIG. 3 is a block diagram of a configuration of the sound quality compensating unit applied to the AM receiving circuit of the present invention. FIG. 4 is a characteristic diagram of characteristics of a low-pass filter (LPF) included in the sound compensating unit. FIG. 5 is a characteristic diagram of characteristics of a high-pass filter (HPF) included in the sound compensating unit. In FIGS. 4 and 5, the horizontal axis shows the electric field intensity (dBμV) of the received broadcast wave signal and the vertical axis shows the degree of effect of the filter. The degree of effect of the filter of FIG. 4 represents that the low-pass filter attenuates the higher frequency component as the degree changes from one to zero. The degree of effect of the filter of FIG. 5 represents that the high-pass filter attenuates the lower frequency component as the degree changes from one to zero. FIG. 6 is a characteristic diagram of characteristics of the amplifying unit included in the sound compensating unit. In FIG. 6, the horizontal axis shows the reception intensity (dBμV) of the received broadcast wave signal and the vertical axis shows the output level (dB) of the audio signal. FIG. 6 includes a characteristic line indicated by Δ, a characteristic line indicated by ♦, a characteristic line indicated by x, and a characteristic line indicated by □. The characteristic line indicated by Δ indicates that the amplifying unit boosts the input audio signal "with" the control in accordance with the signal-meter signal. The characteristic line indicated by ♦ indicates that the input audio signal is boosted "without" the control in accordance with the signal-meter signal. The characteristic line indicated by x indicates that the amplifying unit attenuates the input silence signal (noise) "with" the control in accordance with the signal-meter signal. The characteristic line indicated by □ indicates that the input silence signal (noise) is attenuated "without" the control in accordance with the signal-meter signal. If the signal-meter signal is used to set the boosting function or attenuating function of the amplifying unit, the carrier intensity signal of the IF signal is used at the electric field intensity E1 or less and the signal-meter signal is used at the electric field intensity E1 or more.

The sound quality compensating unit 22 includes an LPF 42 (filter unit, low-pass filter), an HPF 44 (filter unit, high-pass filter), an amplifying unit 46, and a controlling unit 48.

When the broadcast wave received by the antenna 12 has lower electric field intensity, the IF-AGC circuit 18 sets a larger gain for the amplifying circuit included in the IF unit 16 and, therefore, a rate of noise to the audio signal is increased. In this case, by attenuating the higher frequency component of the audio signal, the S/N ratio of the audio signal can be improved to reduce the auditory feeling of noise. The LPF 42 is disposed for the purpose of reducing such auditory feeling of noise. As shown in FIG. 4, the degree of effect of the filter of LPF 42 (filter characteristics) is controlled depending on the control output of the controlling unit 48 described later. For example, when the electric field intensity of the received broadcast wave signal is within a range of about 20 to 45 dBμV, the filter characteristics of the LPF 42 are characteristics that attenuate the higher frequency band of the audio signal as the electric field intensity weakens.

If the higher frequency component of the audio signal passing through the LPF is attenuated relatively significantly, the auditory sound balance may be lost, resulting in muffled sound or low pitch sound that is too loud. The HPF 44 is disposed for the purpose of preventing such an auditory sound balance from being lost. As shown in FIG. 5, the degree of effect of the filter of HPF 44 (filter characteristics) is controlled depending on the control output of the controlling unit 48 described later. For example, when the electric field intensity of the received broadcast wave signal is within a range of about 10 to 35 dBμV, the filter characteristics of the HPF 44 are characteristics that attenuate the lower frequency band of the audio signal as the electric field intensity weakens.

Therefore, the audio signal passing through the LPF 42 and the HPF 44 becomes a signal whose higher and lower frequency bands that are away from the center frequency of the audio signal, are effectively attenuated depending on the electric field intensity of the received broadcast wave signal. In this embodiment, since the filter characteristics of the LPF 42 and the HPF 44 are changed when the electric field intensity of the received broadcast wave signal is in the range equal to or more than E1, the filter characteristics of the LPF 42 and the HPF 44 are controlled depending on the intensity of the signal-meter signal output from the IF-AGC circuit 18.

The amplifying unit 46 is set to either a boosting function that boosts the audio signal passing through the HPF 44 or an attenuating function that attenuates the audio signal. The boosting function or the attenuating function is set in the amplifying unit 46 by the controlling unit 48.

If the desired broadcast station to be selected is suppressed by the effect of the interfering station, the gain of the amplifying circuit of the IF unit 16 is controlled by the IF-AGC circuit 18 to be reduced. In this case, the suppressed audio signal is directly output from the AM detecting unit 20. Therefore, the amplifying unit 46 is set to the boost function with a predetermined amplification rate by inputting either the signal-meter signal output from the IF-AGC circuit 18 or the carrier signal intensity signal output from the integrator 36 when the station is selected and suppressed. As a result, after the audio signal passes through the LPF 42 and the HPF 44 and the higher and lower frequency component are effectively attenuated, the audio signal is boosted as shown in FIG. 6. For example, when the desired broadcast station to be selected is suppressed and the electric field intensity is from 20 dBμV to near 40 dBμV, if no sound quality compensation is performed for the audio signal output from the AM detector 20, the level of the audio signal is reduced and, therefore, the feeling of noise is deteriorated. In this embodiment, when the desired broadcast station is interfered and suppressed by another station, since the boosting is performed by the amplifying unit 46 in the sound quality compensating unit 22 instead of simply increasing the gain of the amplifying circuit of the IF unit 16, the suppression characteristics can be improved to alleviate the feeling of noise, the feeling of muffled sound, and deterioration of audibility.

On the other hand, if the electric field intensity of the received broadcast wave signal is so weak that the audio signal component is buried in noise, the gain of the amplifying circuit of the IF unit 16 is controlled by the IF-AGC circuit 18 to be increased. In this case, the AM detecting unit 20 outputs the audio signal that is auditorily recognized only as noise. Therefore, the amplifying unit 46 is set to the attenuating function with a predetermined attenuation rate by inputting either the signal-meter signal output from the IF-AGC circuit 18 or the carrier signal intensity signal output from the integrator 36. As a result, after the audio signal passes through the LPF 42 and the HPF 44 and the higher and lower frequency component are effectively attenuated, the audio signal is attenuated as shown in FIG. 6. For example, when the electric field intensity is at the level where the S/N ratio cannot be acquired (e.g., 20 dBμV), if no sound quality compensation is performed for the audio signal output from the AM detector 20, the feeling of noise is deteriorated. According to this embodiment, when the received broadcast wave signal has the weak electric field and includes almost only noise, the signal is attenuated by the amplifying unit 46 in the sound quality compensating unit 22 regardless of the gain of the amplifying circuit of the IF unit 16, unpleasantness due to the noise can be alleviated.

For example, the signal-meter signal output from the IF-AGC circuit 18 and the carrier signal intensity signal output from the integrator 36 are added to supply a signal indicating the electric field intensity of the broadcast wave signal to the controlling unit 48. The control signal output from the controlling unit 48 depending on the electric field intensity of the broadcast wave signal is input to the LPF 42, the HPF 44, and the amplifying unit 46 in common, and can set the filter characteristics of the LPF 42 and the HPF 44 and the boosting function or the attenuating function of the amplifying unit 46 at the same time.

In the receiving environment where the reception intensity of the received broadcast wave signal is always E1 or more, only the signal-meter signal may be input to the controlling unit 48.

As described above, with regard to an AM receiving circuit including the FE unit 14 and the IF unit 16 that generate the intermediate frequency signals from the broadcast wave signals received by the antenna 12 to amplify and output the intermediate frequency signals, the IF-AGC circuit 18 that sets the gain of the amplifying circuit in the IF unit 16 depending on the electric field intensity of the received broadcast wave signal, and the AM detecting unit 20 that detects the intermediate frequency signal output from the IF unit 16, the AM receiving circuit includes the sound quality compensating unit 22 including the filter units 42, 44 that extract a predetermined frequency band of the audio signal, the amplifying unit 46 that boosts or attenuates the audio signal in the predetermined frequency band extracted from the filter units 42, 44, and the controlling unit that controls the filter characteristics of the filter units 42, 44 and sets the boosting function or the attenuating function of the amplifying unit 48, depending on the electric field intensity of the broadcast wave signal. Therefore, the AM receiving circuit can improve the suppression characteristics and alleviate unpleasantness due to noise to compensate the sound quality effectively.

Hereinbefore, the embodiments as exemplified and as preferred at present of the AM receiving circuit according to the present invention have been described specifically. The concept of the present invention, however, can be changed variously to be performed and applied, and the scope of claims hereinafter can include various modified versions aside from being limited by prior arts.

It is claimed:

1. An AM receiving circuit comprising:
   an intermediate frequency unit that converts a broadcast wave signal into an intermediate frequency signal and amplifies the intermediate frequency signal;

an AGC (Automatic Gain Control) circuit that generates a signal-meter signal to set a gain of the intermediate frequency unit depending on electric field intensity of the broadcast wave signal;

an AM detecting unit that detects the intermediate frequency signal output from the intermediate frequency unit to produce an audio signal;

an intermediate frequency signal intensity detecting unit that generates an intermediate frequency signal carrier intensity signal indicating an intensity of a carrier frequency component of the intermediate frequency signal output from the intermediate frequency unit; and, a sound quality compensating unit including:
 a filter unit that extracts a predetermined frequency band of the audio signal;
 an amplifying unit that boosts or attenuates the audio signal in the predetermined frequency band extracted from the filter unit; and
 a controlling unit that controls filter characteristics of the filter unit and sets a boosting function or an attenuating function of the amplifying unit, depending on the signal-meter signal and the intermediate frequency signal carrier intensity signal.

2. The AM receiving circuit of claim 1, wherein the filter unit consists of a low-pass filter that attenuates a high frequency band component of the audio signal and a high-pass filter that attenuates a low frequency band component of the audio signal.

3. The AM receiving circuit of claim 2, wherein
 the low-pass filter has filter characteristics that attenuate a higher frequency band component of the audio signal with weakening the electric field intensity in a first predetermined electric field intensity range of the broadcast wave signal, and wherein
 the high-pass filter has filter characteristics that attenuate a lower frequency band component of the audio signal output from the low-pass filter with weakening the electric field intensity in a second predetermined electric field intensity range of the broadcast wave signal.

4. The AM receiving circuit of claim 1, the intermediate frequency signal intensity detecting unit comprising:
 an intermediate frequency filter that extracts a carrier frequency component of the intermediate frequency signal output from the intermediate frequency unit; and
 an integrator that integrates output of the intermediate frequency filter to generate the intermediate frequency signal carrier intensity signal, wherein
 the controlling unit controls the filter characteristics of the filter unit and sets the boosting function or the attenuating function of the amplifying unit, depending on the intermediate frequency signal carrier intensity signal, if the electric field intensity of the broadcast wave signal is lower than a predetermined value, and
 the controlling unit controls the filter characteristics of the filter unit and sets the boosting function or the attenuating function of the amplifying unit, depending on the signal-meter signal output from the AGC circuit, if the electric field intensity of the broadcast wave signal is higher than the predetermined value.

5. The AM receiving circuit of claim 1, wherein
 the intermediate frequency signal intensity detecting unit includes:
  an intermediate frequency filter that extracts the carrier frequency component of the intermediate frequency signal output from the intermediate frequency unit to generate an output signal; and
  an integrator that integrates the output signal of the intermediate frequency filter to generate the intermediate frequency signal carrier intensity signal.

6. The AM receiving circuit of claim 1, wherein
 the controlling unit controls the filter characteristics of the filter unit and sets the boosting function or the attenuating function of the amplifying unit, depending on a signal obtained by adding the signal-meter signal and the intermediate frequency signal carrier intensity signal.

7. The AM receiving circuit of claim 1, wherein
 the controlling unit controls the filter characteristics of the fitter unit and sets the boosting function or the attenuating function of the amplifying unit,
  depending on the signal-meter signal when the signal-meter signal is larger than a predetermined level, and
  depending on the intermediate frequency signal carrier intensity signal when the signal-meter signal is smaller than the predetermined level.

8. The AM receiving circuit of claim 1, wherein
 the controlling unit controls the filter characteristics of the filter unit and sets the boosting function or the attenuating function of the amplifying unit,
  depending on the signal-meter signal when the intermediate frequency signal carrier intensity signal is larger than a predetermined level, and
  depending on the intermediate frequency signal carrier intensity signal when the intermediate frequency signal carrier intensity signal is smaller than the predetermined level.

9. A method of receiving an amplitude modulated broadcast wave signal having an electric field intensity, comprising:
 converting the broadcast wave signal to an intermediate frequency signal;
 generating a signal-meter signal depending on electric field intensity of the broadcast wave signal;
 amplifying the intermediate frequency signal depending on the signal-meter signal;
 generating an intermediate frequency signal carrier intensity signal indicating intensity of carrier frequency component of the intermediate frequency signal;
 detecting the amplified intermediate frequency signal to obtain an audio signal;
 filtering the audio signal to extract a predetermined frequency band of the audio signal, the filtering done by means of a filter having filter characteristics;
 amplifying or attenuating the filtered audio signal; and
 controlling the filter characteristics and the amplification or attenuation of the audio signal in response to the signal-meter signal and the intermediate frequency signal carrier intensity signal.

10. The method of receiving an amplitude modulated broadcast wave signal of claim 9, wherein filtering the audio signal further comprises:
 attenuating high frequency components of the audio signal by means of a low pass filter; and
 attenuating low frequency components of the audio signal by means of a high pass filter.

11. The method of receiving an amplitude modulated broadcast wave signal of claim 10, further comprising:
 controlling at least one of the attenuation factor of the low pass filter, the attenuation factor of the high pass filter, and the amplification or attenuation of the filtered audio signal in response to the signal-meter signal and the intermediate frequency signal carrier intensity signal.

12. The method of receiving an amplitude modulated broadcast wave signal of claim 11, wherein at least one of the attenuation factor of the high pass filter and the attenuation factor of the low pass filter are increased as the electric field intensity of the broadcast wave signal decreases.

13. The method of receiving an amplitude modulated broadcast wave signal of claim 10, wherein
generating an intermediate frequency signal carrier intensity signal further comprising comprises:
filtering the amplified intermediate frequency signal to extract a carrier frequency component of the intermediate frequency signal; and
integrating the extracted carrier frequency component to produce the intermediate frequency carrier intensity signal; and
controlling the filter characteristics and the amplification or attenuation of the audio signal further comprises:
controlling at least one of the attenuation factor of the low pass filter, the attenuation factor of the high pass filter, and the amplification or attenuation of the filtered audio signal in response to the signal-meter signal if the electric field intensity of the broadcast wave signal is higher than a predetermined value; and
controlling at least one of the attenuation factor of the low pass filter, the attenuation factor of the high pass filter, and the amplification or attenuation of the filtered audio signal in response to the intermediate frequency signal carrier intensity signal if the electric field intensity of the broadcast wave signal is not higher than the predetermined value.

14. A sound quality compensating unit for use in an AM radio receiver providing an audio signal, a signal-meter signal corresponding to the electric field strength of a received broadcast wave signal and an intermediate frequency signal carrier intensity signal corresponding to intensity of carrier frequency component of intermediate frequency signal generated from the received broadcast wave signal, the sound quality unit comprising:
a filter unit that extracts a predetermined frequency band of the audio signal;
an amplifying unit that boosts or attenuates the audio signal in the predetermined frequency band extracted from the filter unit; and
a controlling unit that controls filter characteristics of the filter unit and sets a boosting function or an attenuating function of the amplifying unit, in response to the signal-meter signal and the intermediate frequency signal carrier intensity signal.

15. The sound quality compensating unit of claim 14, wherein the filter unit consists of a low-pass filter that attenuates a high frequency band component of the audio signal and a high-pass filter that attenuates a low frequency band component of the audio signal output from the low-pass filter.

16. The sound quality compensating unit of claim 15, wherein
the low-pass filter has filter characteristics that attenuate a higher frequency band component of the audio signal with weakening the electric field intensity in a first predetermined electric field intensity range of the broadcast wave signal, and wherein
the high-pass filter has filter characteristics that attenuate a lower frequency band component of the audio signal output from the low-pass filter with weakening the electric field intensity in a second predetermined electric field intensity range of the broadcast wave signal.

* * * * *

UNITED STATES PATENT AND TRADEMARK OFFICE
CERTIFICATE OF CORRECTION

| | |
|---|---|
| PATENT NO. | : 7,664,197 B2 |
| APPLICATION NO. | : 10/599456 |
| DATED | : February 16, 2010 |
| INVENTOR(S) | : Saito et al. |

It is certified that error appears in the above-identified patent and that said Letters Patent is hereby corrected as shown below:

Column 10, line 2: replace "fitter" with --filter--.

Column 10, line 13: replace "fitter" with --filter--.

Signed and Sealed this

Twenty-third Day of March, 2010

David J. Kappos
*Director of the United States Patent and Trademark Office*